United States Patent
Lin et al.

(10) Patent No.: US 11,918,938 B2
(45) Date of Patent: Mar. 5, 2024

(54) DEVICE FOR BUBBLE REMOVAL FROM VISCOUS FLUID

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Chian-Niang Lin, Nanjing (CN); Barry Tsao, Jhubei (TW); Tsung Tso Tsai, Nanjing (CN)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 470 days.

(21) Appl. No.: 16/845,483

(22) Filed: Apr. 10, 2020

(65) Prior Publication Data
US 2021/0187415 A1    Jun. 24, 2021

(30) Foreign Application Priority Data
Dec. 20, 2019    (CN) .......................... 201911330591.8

(51) Int. Cl.
*B01D 19/00* (2006.01)
*G03F 7/00* (2006.01)

(52) U.S. Cl.
CPC ..... *B01D 19/0042* (2013.01); *B01D 19/0021* (2013.01); *G03F 7/70858* (2013.01)

(58) Field of Classification Search
None
See application file for complete search history.

(56) References Cited

U.S. PATENT DOCUMENTS 1,306,003 A * 6/1919 Name .................... B01D 45/16
                                                                237/68
1,387,748 A * 8/1921 Wilson ............... B01D 19/0057
                                                                96/195
1,649,556 A  11/1927 Waters
(Continued)

FOREIGN PATENT DOCUMENTS

CN    103567110    2/2014
CN    205269132    6/2016
(Continued)

OTHER PUBLICATIONS

Translation of JP2008073606 accessed Aug. 4, 2022 (Year: 2008).*
Office Action dated Aug. 4, 2021 for corresponding case No. TW 11020752950. (pp. 1-7).

*Primary Examiner* — Christopher P Jones
*Assistant Examiner* — Phillip Y Shao
(74) *Attorney, Agent, or Firm* — Hauptman Ham, LLP

(57) ABSTRACT

A de-bubbling slide is configured to fit in a dispensing vessel and capture, with a receiving element, a flow of fluid into the dispensing vessel from a fluid inlet. The receiving element of the de-bubbling slide directs the flow of fluid to a flow surface of the de-bubbling slide from which gas dissolved in the flow of fluid, or bubbles in the flow of fluid, escape from the fluid. Openings in an upper surface of the de-bubbling slide allow the escaped gas to exit the de-bubbling slide.

20 Claims, 10 Drawing Sheets

(56) References Cited

U.S. PATENT DOCUMENTS

| | | | | |
|---|---|---|---|---|
| 1,799,684 A | * | 4/1931 | Gilbert | F04F 5/08 96/171 |
| 2,705,053 A | * | 3/1955 | Morris | F16N 39/002 210/512.1 |
| 3,352,090 A | * | 11/1967 | Stillebroer | E21B 43/38 96/208 |
| 3,951,813 A | * | 4/1976 | Palma | B04C 3/02 210/512.1 |
| 3,970,438 A | * | 7/1976 | Sama | B01D 19/0042 96/194 |
| 4,390,351 A | * | 6/1983 | Matsui | B04C 1/00 55/459.3 |
| 4,723,972 A | * | 2/1988 | Leach | B01D 53/24 55/398 |
| 5,510,019 A | * | 4/1996 | Yabumoto | B01D 19/0057 96/174 |
| 7,998,250 B2 | * | 8/2011 | Pondelick | B01D 50/20 96/191 |
| 8,444,586 B2 | * | 5/2013 | Beck | B01D 19/0057 604/4.01 |
| 2005/0247198 A1 | * | 11/2005 | Kent | B01D 19/0042 96/219 |
| 2007/0256561 A1 | * | 11/2007 | Ooya | B01D 19/0036 96/6 |
| 2008/0179227 A1 | * | 7/2008 | Saito | B01D 19/0057 210/512.1 |
| 2014/0034584 A1 | | 2/2014 | Marumoto et al. | |
| 2014/0349379 A1 | | 11/2014 | Bachellier | |
| 2015/0283480 A1 | * | 10/2015 | Chien | B01D 19/0042 96/155 |
| 2018/0193772 A1 | * | 7/2018 | Braun | E03F 1/00 |
| 2019/0091607 A1 | | 3/2019 | Kirk et al. | |
| 2020/0215534 A1 | * | 7/2020 | Lin | B01D 19/0042 |

FOREIGN PATENT DOCUMENTS

| | | |
|---|---|---|
| CN | 207973705 | 10/2018 |
| JP | 1999123303 | 5/1999 |
| JP | H11123303 | 5/1999 |
| JP | 200873606 | 4/2008 |
| JP | 2008073606 A * | 4/2008 |
| JP | 201029774 | 2/2010 |
| KR | 20010059078 | 7/2001 |
| TW | 201420209 | 6/2014 |

* cited by examiner

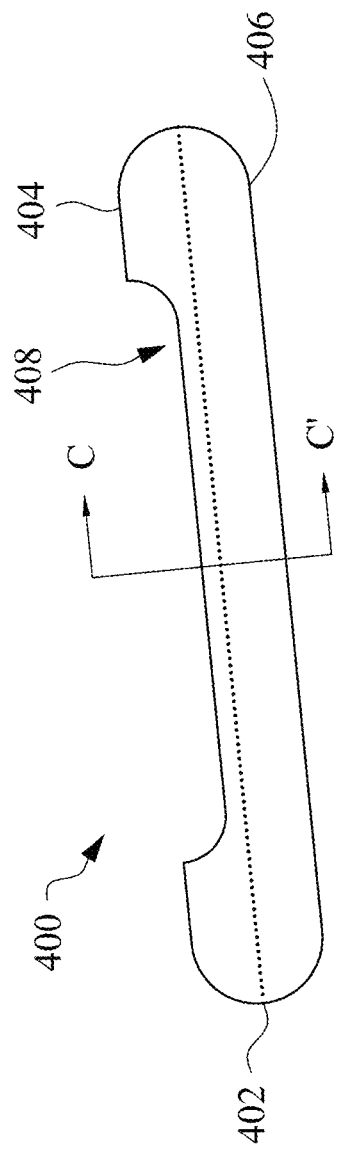
FIG. 4A
FIG. 4C
FIG. 4B

DEVICE FOR BUBBLE REMOVAL FROM VISCOUS FLUID

PRIORITY CLAIM

The present application claims priority to the China Patent Application No. 201911330591.8, filed Dec. 20, 2019, which is incorporated herein by reference in its entirety.

BACKGROUND

Integrated circuit manufacturing includes processes related to film deposition for pattern transfer to underlying layers of the integrated circuit. In some instances, the deposited films are temporarily placed on an integrated circuit substrate, and then removed after pattern transfer is completed. Pattern transfer includes photolithography, electron-beam lithography, and other methods of pattern transfer. Pattern transfer is improved when the deposited pattern-transfer film is of uniform composition and thickness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D are views of a de-bubbling slide, in accordance with some embodiments.

DETAILED DESCRIPTION

Figure 1:
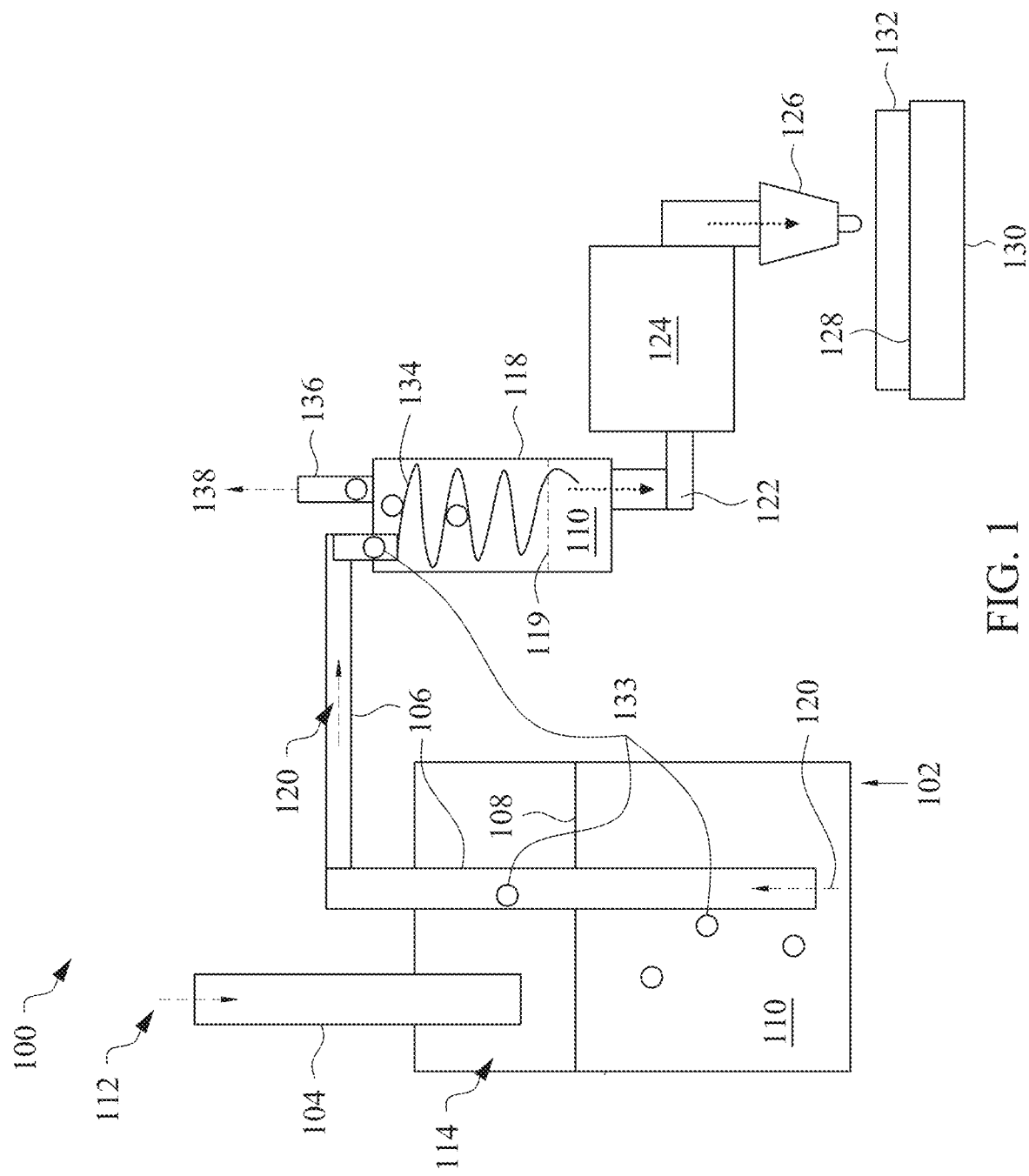
FIG. 1 is a schematic diagram of a fluid dispensing system, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Deposition of viscous fluids such as photoresist (or, photoresist material, or mask material) is sometimes hampered by the inclusion of bubbles within the fluid. The bubbles interrupt the fluid uniformity after deposition onto a substrate. In the case of semiconductor manufacturing, bubbles in photoresist result in irregularities in a material applied to the top surface of a substrate. Bubbles create voids in photoresist layers which results in pattern disruptions associated with short-circuits between features, or voids in a subsequently formed layer of an integrated circuit or semiconductor device.

Photoresist or other fluid materials are received at a manufacturing facility in transportation or storage vessels. The photoresist material or fluid material is transferred out of the transportation or storage vessel and into a dispensing vessel within the manufacturing facility. One method of transferring fluid from the storage vessel into a dispensing vessel is by pressurizing the vessel to force fluid out of the storage vessel and into the dispensing vessel. The fluid used to form the patterning layer or patterning film (e.g., the photoresist layer) sometimes has bubbles formed therein because of the pressurizing gas. In some embodiments, bubbles are formed directly when the pressurization gas is applied to the fluid. In some embodiments, the pressurization gas dissolves in the fluid, and the dissolved gas later spontaneously forms a bubble in the fluid when the pressure applied to the fluid decreases. Pressurization of the fluid decreases when the fluid exits the transportation or storage vessel and enters the dispensing vessel. When the bubbles in the fluid remain in the fluid, and travel with the fluid onto the surface of an integrated circuit during a manufacturing process, the bubbles introduce irregularities in the material deposited on the top of the integrated circuit. The bubble irregularities lead to damage of the layer of the integrated circuit to which the pattern is being transferred, or to parts of the integrated circuit that are supposed to be protected by the material during one or more subsequent processes, e.g., an etching process.

FIG. 1 is a schematic diagram of a fluid dispensing system 100, in accordance with some embodiments. Fluid dispensing system 100 includes a supply vessel 102 for storing a fluid 110, a dispensing vessel 118, a pump 124, and a dispensing nozzle 126. Supply vessel 102 is configured to be sealed such that the interior volume of the supply vessel is gas-tight and able to be pressurized. When the supply vessel is pressurized, pressurization gas enters the supply vessel through a pressurization line 104 fitted to an outside source of pressurization gas. Pressurization gas fills the supply vessel 102 and forces the fluid therein out of the supply vessel, through a transfer line 106, into a dispensing vessel 118. Transfer line 106 extends from an exterior of supply vessel 102 to below the top surface 108 of the fluid 110. A flow of pressurization gas 112 enters a headspace 114 of the supply vessel 102, forcing the top surface 108 down within the supply vessel 102. In some embodiments, the pressurization gas is nitrogen or another mixture of gas that is unreactive with the fluid. Fluid 110 is driven through transfer line 106 and into a dispensing vessel 118 as a result of the additional pressurization gas added to the headspace of the supply vessel 102.

A first flow of fluid 120 within transfer line 106 ends when the fluid exits the transfer line 106 and enters a dispensing vessel 118.

A second flow of fluid begins when the fluid exits the transfer line 106 and enters the dispensing vessel 118. The dispensing vessel 118 comprises a de-bubbling slide 134. Fluid travels down de-bubbling slide 134 and collects in a lower region of dispensing vessel 118. In some embodiments, the second flow of fluid is dependent on the first flow of fluid, such that when the first flow is a small flow rate, the fluid in the second flow of fluid is thinner on the flow surface of the de-bubbling slide 134, and when the first flow is a large flow rate, the fluid in the second flow of fluid is thicker on the flow surface of the de-bubbling slide 134.

A third flow of fluid begins as the fluid exits the dispensing vessel 118 and travels through a deposition line 122, pump 124, and dispensing nozzle 126 before being dispersed onto a surface 128 of wafer 130. Deposition line 122 fluidly connects dispensing vessel 118 with pump 124. In some embodiments, wafer 130 has a portion of an integrated circuit therein, and the fluid dispensed onto surface 128 of wafer 130 is configured to receive a pattern, which pattern is to be transferred to at least one layer of the wafer 130 through openings in the fluid after the fluid is processed to receive the pattern.

During the process of pressurizing the fluid 110 in the supply vessel 102, pressurization gas dissolves in the fluid or directly forms bubbles 133 within the fluid 110. In accordance with some embodiments, the pressurization gas is nitrogen, which is chemically inert so as not to react with or degrade the fluid 110. Bubbles are formed directly, or upon a reduction in pressure of the fluid, either within the supply vessel, the transfer line 106, or the dispensing vessel 118.

The inclusion of bubbles within dispensing vessel 118 becomes problematic when the bubbles travel past dispensing vessel 118, through deposition line 122, and out dispensing nozzle 126 into the film coating 132. Fluid dispensing system 100 helps to remove bubbles from fluids such as photoresist or other fluids.

Dispensing vessel 118 includes de-bubbling slide 134 to which fluid is applied from the transfer line 106. De-bubbling slide 134 has a receiving element at an upper end of the de-bubbling slide, a dispensing element at a bottom end of the de-bubbling slide, and a slide path along which the fluid flows between the receiving element and the dispensing element. De-bubbling of fluid 110 occurs at the receiving element and along the slide path of the de-bubbling slide 134.

In at least some embodiments, de-bubbling of a fluid applied to a receiving element at an upper end of de-bubbling slide 134 occurs by one or more mechanisms. One mechanism is elimination of bubble formation when fluid exits transfer line 106 and flows against a top surface 119 of fluid 110 within dispensing vessel 118 (FIG. 2B). Another mechanism is prolongation of the time between fluid exiting transfer line 106 within dispensing vessel 118 and making contact with a top surface of the fluid 110 within dispensing vessel 118. By prolonging the time between fluid exiting the transfer line 106 and making contact with the top surface of the fluid within the dispensing vessel, bubbles present within the flow of fluid 120 in transfer line 106 have an opportunity to rise to a top surface of the fluid on the slide path of the bubbling slide, and then burst. Pressurization gas and other bubbles exiting the fluid are removed from the dispensing vessel 118 through an evacuation line 136. In some embodiments, evacuation line 136 is held at atmospheric pressure. In some embodiments, evacuation line 136 is connected to a pump 138 which creates negative pressure above the fluid in the dispensing vessel 118 to draw bubbles and dissolved gases out of the fluid.

As fluid viscosity increases, de-bubbling of a fluid becomes increasingly difficult because bubbles and dissolved gases have greater difficulty, with respect to less viscous fluids, at escaping the fluid. In some embodiments, a de-bubbling slide in a dispensing tank is used to remove bubbles and dissolved gases from a flow of a fluid having a viscosity ranging from about 20 millipascal seconds (mPa·s) and to about 3000 mPa·s at around 25° C. In some embodiments, the de-bubbling of the less viscous fluids occurs at an upper portion of the de-bubbling slide, while de-bubbling of the more viscous fluids occurs along a greater length of the de-bubbling slide because of the greater difficulty of the bubbles to escape the fluid.

In some embodiments of fluid dispensing system 100, a de-bubbling slide 134 is selected and inserted into dispensing vessel 118 according to a viscosity of the fluid 110 to be transferred and dispensed. According to some embodiments, the de-bubbling slide is a helical slide which coils downward toward a bottom of the dispensing vessel where the fluid (e.g., photoresist or another spin-coat compatible fluid) is held until dispensing. A helical slide, whether a circular coil, an elliptical coil, or some other coil shape, affords a greater amount of slide length from the fluid receiving element at the upper end of the helical slide, to the lower end of the de-bubbling slide where the fluid exits the slide and is held prior to dispensing. A greater amount of slide length increases the amount of de-bubbling which occurs as a fluid travels along the slide. Increasing the length, and/or adjusting the angle of the de-bubbling slide, allows for adjustment to the fluid retention time on the slide to accomplish de-bubbling. A de-bubbling slide with a steeper angle is selected for fluids having a low viscosity, and a de-bubbling slide with a smaller angle is selected for fluids having a higher viscosity. In some embodiments of fluid dispensing system 100, de-bubbling slide 134 is a made of a metal, a plastic material, or a fluorocarbon material such as polytetrafluoroethylene (PTFE). In some embodiments, de-bubbling slide 134 has openings in an upper surface of the de-bubbling slide. In some embodiments, the de-bubbling slide is a tube. In some embodiments, the tube wall has openings in a top side thereof, and the flow surface is an inner surface of the tube. In some embodiments, the flow surface of a de-bubbling slide apparatus includes a coating in order to promote smooth flow of the fluid to a lowest portion of the flow surface. In some embodiments, the coating is a hydrophobic coating. In some embodiments, the coating is a hydrophilic coating. The coating is configured to promote smooth fluid flow down the flow surface. In some instances, smooth flow is associated with reducing an amount of contact surface between the coating and the fluid, and a coating type, and the degree of contact angle modification of the fluid against the coating, is selected based on the chemical characteristics of the fluid. In some embodiments of fluid dispensing system 100, de-bubbling slide 134 is supported and held away from an inner sidewall of the dispensing vessel by a bracket 224 (FIG. 2B). In some embodiments, the de-bubbling slide is made of a rigid material that supports the weight of the de-bubbling slide and the fluid thereon without deformation. In some embodiments, the de-bubbling slide material is flexible and the angle of the flow surface is adjusted by raising and lowering part of the de-bubbling slide within the dispensing vessel. In some embodiments, the angle is adjusted automatically based on a characteristic of the fluid. In some embodiments, the angle is adjusted manually and the de-bubbling slide retains the adjusted angle for a multiple fluid additions or maintenance cycles of the fluid dispensing system. In some instances, a low angle promotes de-bubbling of materials of a range of viscosities over different lengths of the de-bubbling slide that are less than the total length of the slide. Thus, a single low slide angle is suitable for de-bubbling fluid without resorting to frequent slide angle adjustment. In some embodiments, the lowest part of the de-bubbling slide is fastened to the dispensing vessel while the upper portion is movable. In some embodiments, the de-bubbling slide is a coil around a center of the dispensing vessel. In some embodiments, the de-bubbling slide has a serpentine (zig-zag) shape or follows a conical path from a top to a bottom of the dispensing vessel. In some embodiments, the angle of the flow surface is adjusted to adjust the flow rate (also referred to as the flow velocity) of the flow of fluid down the flow surface of the de-bubbling slide. Adjusting the flow rate of the flow of fluid down the flow surface provides an adjustment to the time during which the fluid on the flow surface is able to de-bubble, e.g., the residence time of the fluid on the flow surface of the de-bubbling slide, before collecting at the bottom of the dispensing vessel.

Figure 2A:
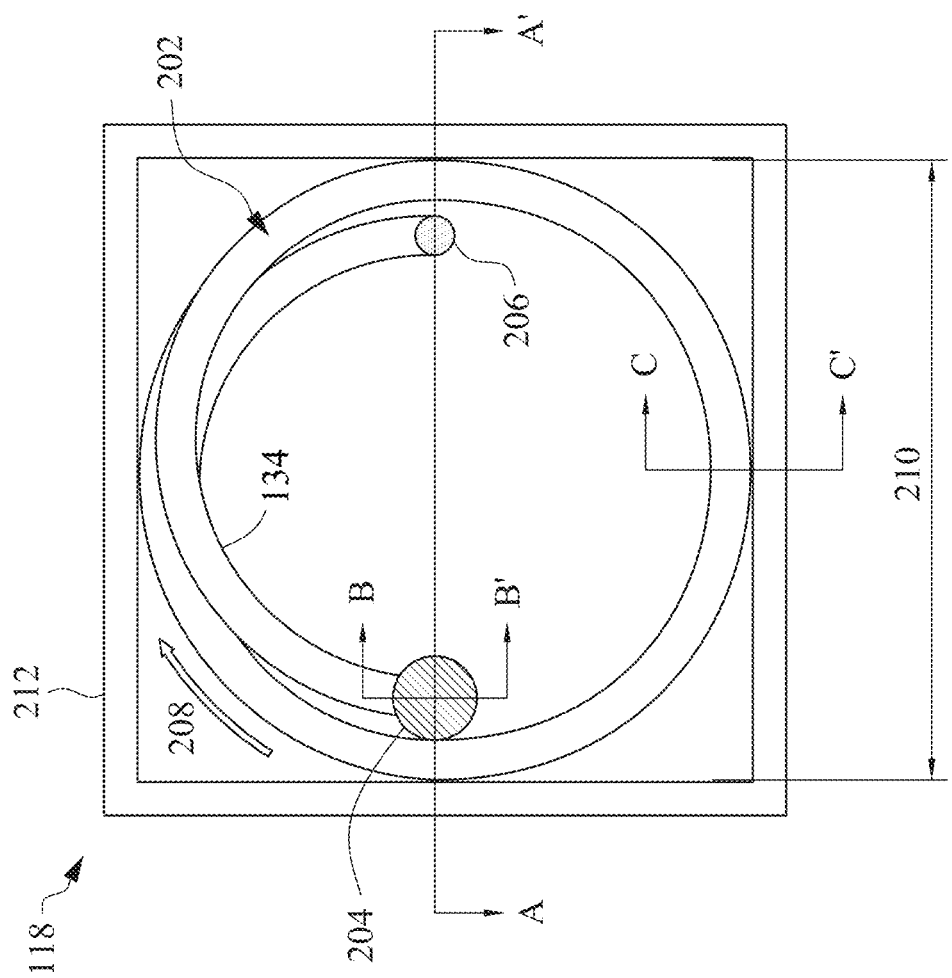
FIG. 2A is a top view of a dispensing vessel, in accordance with some embodiments.
Figure 2B:
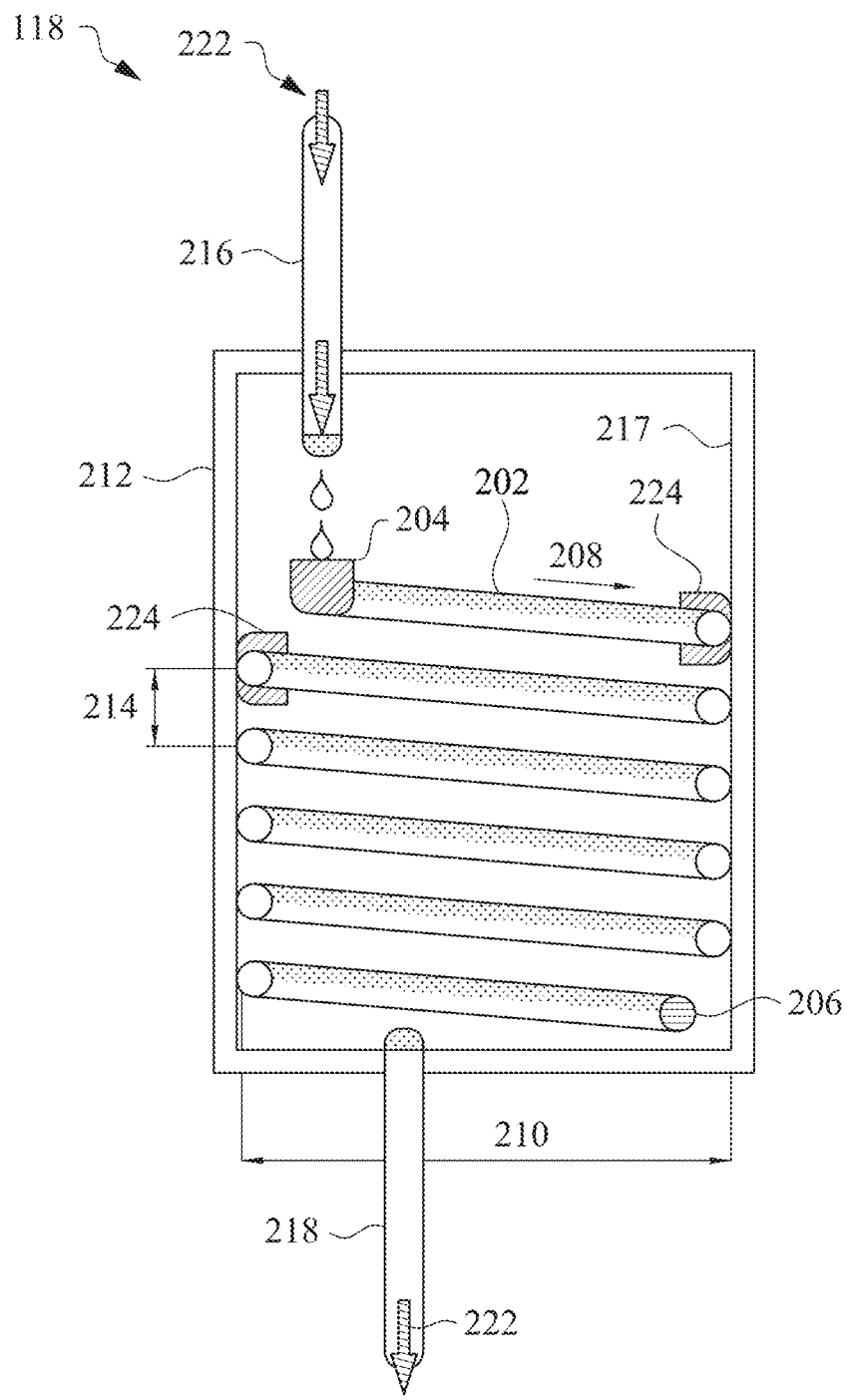
FIG. 2B is a cross-sectional view of the dispensing vessel of FIG. 2A, in accordance with some embodiments.

FIG. 2A is a top view of a dispensing vessel 118 in accordance with some embodiments. Dispensing vessel 118 has a wall 212 that surrounds de-bubbling slide 134 in the dispensing vessel 118. De-bubbling slide 134 has a flow surface 202 and a receiving element 204 at an upper end thereof, and a dispensing element 206 at a lower end thereof. In some embodiments, receiving element 204 is optional and fluid flows direction to flow surface 202 of the de-bubbling slide 134. In some embodiments, dispensing element 206 is optional. Fluid travels along flow surface 202 of the de-bubbling slide 134 in a flow direction 208. De-bubbling slide 134 has a slide diameter 210 within the wall 212 of the dispensing vessel 118.

FIG. 2B is a cross-sectional view of a dispensing vessel 118 with de-bubbling slide 134 situated therein along cross-sectional line A-A' (FIG. 2A), in accordance with some embodiments. Elements of FIG. 2A which are the same as elements of FIG. 2B have a same element identifier. A person of ordinary skill in the art will understand that other embodiments not expressly set forth herein are included within the scope of the present disclosure, and that the embodiments of FIGS. 2A-2B are representative of a class of de-bubbling slides and dispensing vessels. In FIG. 2B, dispensing vessel 118 includes a portion of a transfer line 216 entering a top end of the dispensing vessel 118. A dispensing line 218 exits a bottom end of the dispensing vessel 118. Fluid, such as photoresist, that enters the dispensing vessel 118 through the transfer line 216 has a flow direction 222. Fluid that exits the dispensing vessel 118 through the dispensing line 218 has a same flow direction 222 exiting the fluid dispensing system 110. Within the dispensing vessel 118, fluid exits the transfer line 216 and enters a receiving element 204 at an upper end of the de-bubbling slide 134. As fluid flows against the receiving element 204, the fluid spreads out against the top surface of the receiving element 204 so that there is less distance for bubbles to travel in order to exit the fluid and to pop, releasing the bubble gas into a volume above the fluid on the de-bubbling slide. Fluid travels along de-bubbling slide 134 with a flow direction 208, around the de-bubbling slide.

In FIG. 2B, slide diameter 210 extends along the edges of the de-bubbling slide close to inner sidewall 217 of dispensing vessel 118. Dispensing vessel 118 is square. In dispensing vessel 118, a uniform gap exists between inner sidewall 217 and de-bubbling slide 134. In some embodiments, the de-bubbling slide is offset within the dispensing vessel and is closer to one wall than an opposite wall. In some embodiments, the de-bubbling slide fastens to the dispensing vessel wall at a single point, and is separated from the other walls of the dispensing vessel. In some embodiments, dispensing vessel 118 is cylindrical, round, rectangular, or conical. In some embodiments, a non-uniform gap exists between inner sidewall 217 and an outer edge of the de-bubbling slide 134. In FIGS. 2A and 2B, the de-bubbling slide 134 is circular and a slope of the de-bubbling slide is determined by dividing the length of the de-bubbling slide by the vertical distance between the receiving element and the dispensing element 206. In some embodiments, the de-bubbling slide has an elliptical profile for each interval with a height 214. In some embodiments, the de-bubbling slide has a rectilinear profile for each interval with height 214. In some embodiments, the de-bubbling slide forms a helix which coils downward within the dispensing vessel.

Figure 3B:
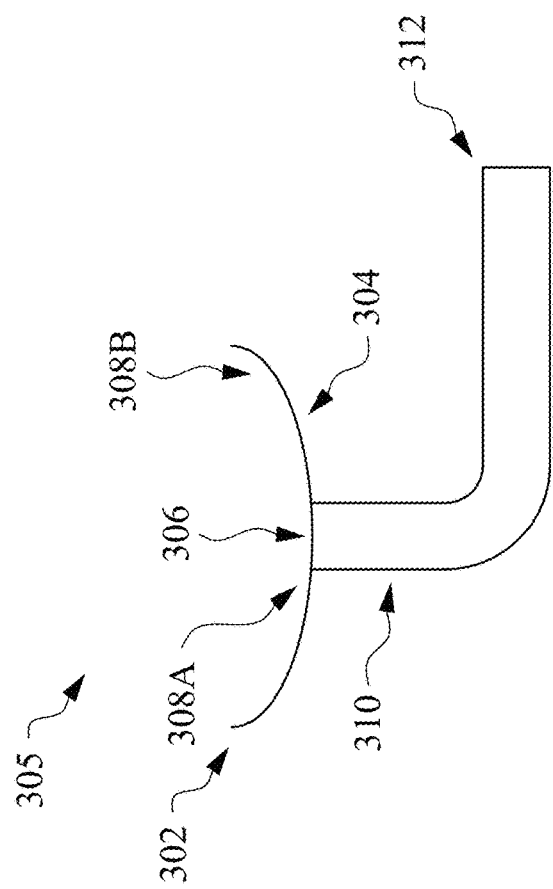
FIGS. 3A-3H are views of a fluid receiving element, in accordance with some embodiments.
Figure 3A:
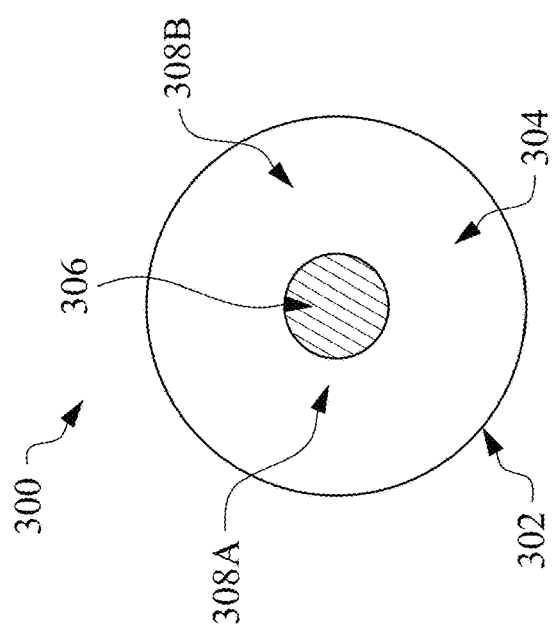

FIG. 3A is a top view of a fluid receiving element 300, in accordance with some embodiments. Fluid receiving elements 300, 305, 315, and 325 are non-limiting embodiments of the receiving element 204 described above in regard to FIGS. 2A and 2B. It is understood that the non-limiting embodiments of fluid receiving elements 300, 305, 315, and 325 that follow describe features and aspects of the fluid receiving element at an upper end of a de-bubbling slide found in other embodiments of a de-bubbling slide with a fluid receiving element thereon. Fluid receiving element 300 includes a bowl 304 with a rim 302. Bowl 304 is circular. In some embodiments, the bowl of a fluid receiving element has a different shape such as an ellipse, a horseshoe, a square, a rectangle, or a paraboloid. In some embodiments, the bowl of a fluid receiving element tapers from the rim to the central location of the bowl where an opening 306, at a lowest portion of the bowl 304, is located. Fluid flows into opening 306 and enters onto the flowing surface of the de-bubbling slide. According to some embodiments, fluid entering the bowl travels through the volume of the bowl directly into the opening 306. According to some embodiments, fluid entering the bowl enters the bowl and strikes a side region of the bowl, such as at location 308A or location 308B. The inner surface of the fluid receiving element bowl, or landing surface, is configured to receive the dispensed fluid from a transfer line without generating additional bubbles within the transferred fluid. After the fluid enters the bowl and strikes the landing surface at a side region of the bowl, the fluid spreads across the landing surface of the bowl before flowing to the bottom of the bowl and into opening 306.

FIG. 3B is a cross-sectional view of a fluid receiving element 305 along cross-sectional line A-A' (FIG. 2A), in accordance with some embodiments. Fluid receiving element 305 is a circular fluid receiving element. Features of FIG. 3A which are the same as elements in FIG. 3B have a same element identifier. FIG. 3B further shows a connection between the bowl 304 of the fluid receiving element 305 and portions of de-bubbling slide below the fluid receiving element. In particular, a downtube 310 connects the bowl 304 to a portion 312 of the de-bubbling slide. In some embodiments, fluid is added to bowl 304 at opening 306 and enters downtube 310 directly. In some embodiments, fluid enters the bowl 304 at location 308A or 308B and strikes an inner surface (or, an upper surface) of the bowl. According to some embodiments, a location where a fluid enters the bowl is selected based on viscosity of the fluid and individual process parameters associated with bubble formation in the fluid. For example, a fluid with low viscosity is added to a bowl at opening 306, location 308A, or location 308B without significant bubble formation associated by the liquid entering the bowl and striking the bowl or downtube 310. However, in some embodiments, a more viscous fluid experiences more rapid de-bubbling when the fluid strikes the inner surface of the bowl to spread out and promote bubble travel within the fluid to an upper surface of the fluid, so the bubbles can pop. The flow of fluid into the bowl is adjusted to strike the bowl surface at a location where the curvature of the bowl accommodates the volume of fluid and the fluid viscosity to promote fluid spreading across the bowl surface without formation of additional bubbles in the fluid, or without splashing and forming droplets of fluid across the bowl or outside the bowl.

Figure 3D:
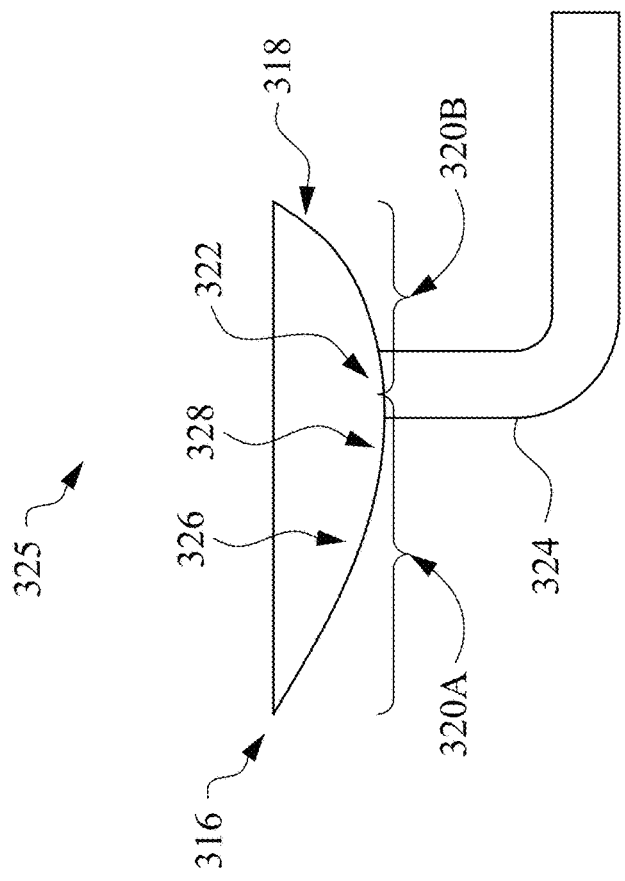
Figure 3C:
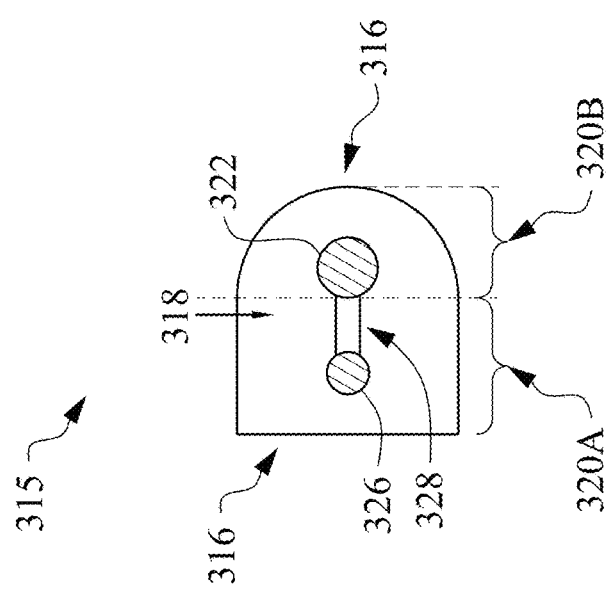

FIG. 3C is a top view of a fluid receiving element 315, in accordance with some embodiments. Fluid receiving element 315 has a rim 316 round the bowl 318. Bowl 318 is an asymmetric bowl, with a round side 320B and a squared side 320A. Round side 320B of bowl 318 has a curved inner surface, or landing surface, configured to receive and redirect fluid from a transfer line into opening 322. Opening 322 is to a downpipe (not shown) of the de-bubbling slide. Fluid receiving element 315 is configured to receive fluid at a location 326 in the squared side 320A of the fluid receiving element. Fluid exits a transfer line and lands on location 326 before sliding down slide path 328 and into opening 322 of the bowl of the fluid receiving element. An area of squared side 320A of the landing surface of bowl 318 is a flat portion and is large enough to accommodate a variety of fluid flow rates into bowl 318 without spilling over rim 316. Slide path 328 is on a low-curvature side of fluid receiving element 315 in order to extend a retaining time of fluid in the bowl before the fluid flows into opening 322 to undergo de-bubbling along the length of the de-bubbling slide.

FIG. 3D is a cross-sectional view of a fluid receiving element 325 along cross-sectional line A-A', according to some embodiments. Elements of FIG. 3D that resemble elements of fluid receiving element 315 in FIG. 3C have a same element identifier. Bowl 318 has a rim 316. Fluid enters the bowl from the top side in order to enter the downpipe 324 of the de-bubbling slide. Rounded side 320B is on one side of the opening 322 downpipe 324, and squared side 320A is on the other side of opening 322. A position of the bowl beneath a flow of fluid from a transfer line is adjustable by turning or rotating the de-bubbling slide within the dispensing vessel, a location at which the flow of fluid enters and strikes the inner surface of bowl 318 is adjustable. In some embodiments, fluid enters downpipe 324 directly through opening 322 without striking the inner surface of bowl 318. In some embodiments, fluid strikes the inner surface of at the location 326 before the fluid follows a slide path 328 to enter opening 322.

Figure 3F:
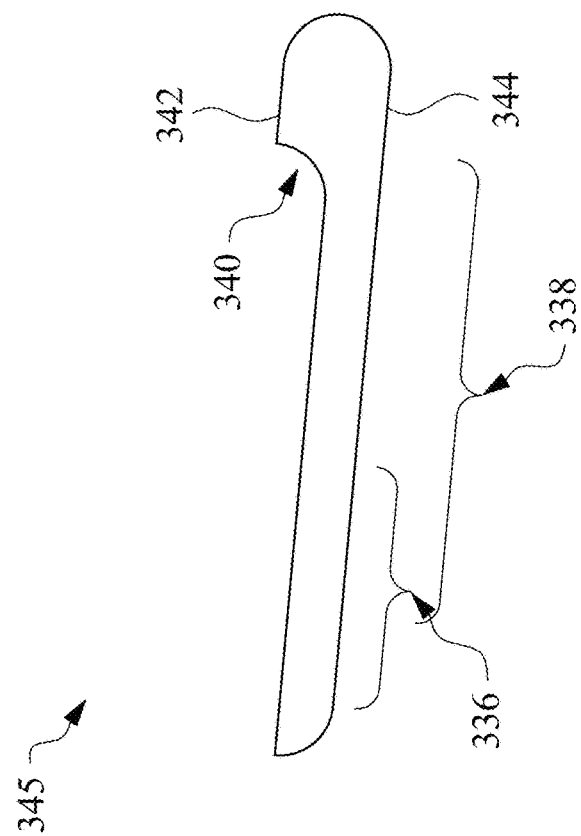
Figure 3E:
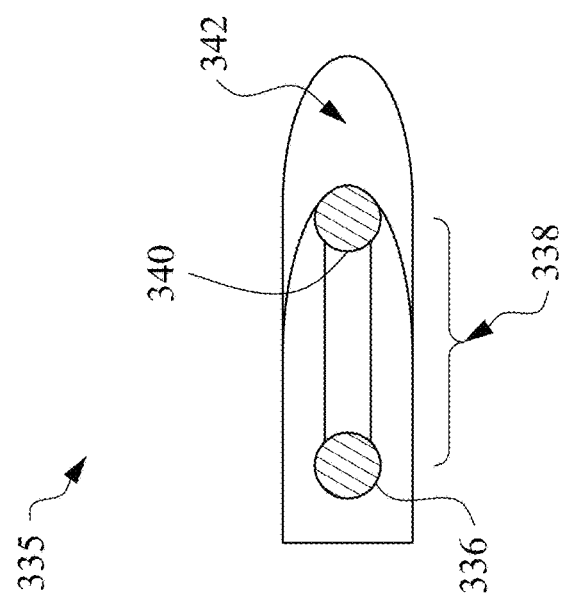

FIG. 3E is a top view of a fluid receiving element 335, in accordance with some embodiments. Fluid receiving element 335 is a cutaway terminal portion of the de-bubbling slide configured to receive fluid from a transfer line into a dispensing vessel. Fluid receiving element 335 configured to receive fluid at a receiving location 336, to allow the fluid to disperse across the fluid receiving element 335 along slide path 338, and enter opening 340 into the length of the de-bubbling slide. Fluid receiving element 335 is a continuation of the body of the de-bubbling slide, with top surface 342 extending smoothly into receiving location 336 and slide path 338.

FIG. 3F is a cross-sectional view of fluid receiving element 345 along cross-sectional line A-A', in accordance with some embodiments. Elements of fluid receiving element 345 which are the same as elements of fluid receiving element 335 have a same element identifier. Fluid receiving element 345 is configured to receive fluid from transfer line at a receiving location 336 at an upper end of the fluid receiving element. Slide path 338 extends from fluid receiving element 345 down to opening 340. Top surface 342 of the de-bubbling slide halts and the de-bubbling slide bottom surface 344 comprises the "body" of fluid receiving element 345, including receiving location 336 and slide path 338.

Figure 3H:
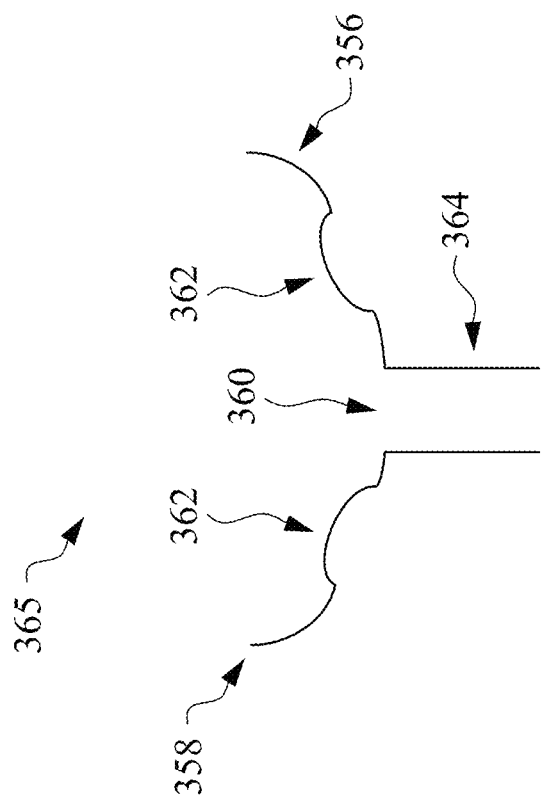
Figure 3G:
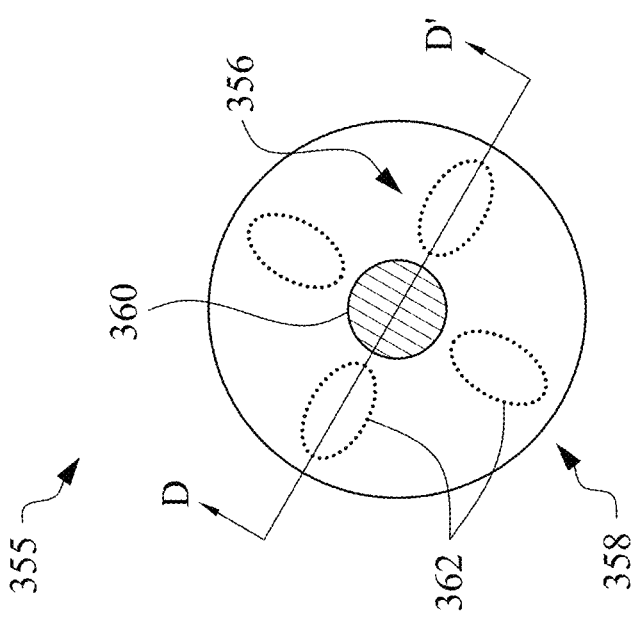

FIG. 3G is a top view of a fluid receiving element 355, in accordance with some embodiments. Fluid receiving element 355 is a round receiving element. In some embodiments, the shape of the receiving element is elliptical, square, rectangular, or a paraboloid. Fluid receiving element 355 is a bowl 356 with a rim 358 and an opening 360 through which fluid which enters the receiving element moves to enter the length of the de-bubbling slide (not shown, but see downtube 310 FIG. 3B). In some embodiments, bowl 356 has dispersion bumps 362 around opening 360. Dispersion bumps 362 may be incorporated into many of the bowl designs described herein in order to promote spreading of the fluid across the bowl surface without forming additional bubbles in the fluid, or to promote reduction in the volume or number of droplets of fluid that are formed when the fluid enters the bowl. In fluid receiving element 355, dispersion bumps 362 serve to redirect the flow of fluid entering the bowl 356 in order to promote spreading of the fluid before entry of the fluid into opening 360. Cross-sectional line D-D' indicates a position of a cross-sectional view shown in FIG. 3H.

FIG. 3H is a cross-sectional view of a fluid receiving element 365 along cross-sectional line D-D', in accordance with some embodiments. Elements of FIG. 3H similar to elements of fluid receiving element 355 in FIG. 3G have a same element identifier. In FIG. 3H, the shape of dispersion bumps 362, extending upward from the downpipe 364, is shown. The shape of dispersion bumps 362 is related to the propensity of the fluid received in the bowl to spread and lose bubbles when the fluid strikes the inner surface of bowl 356. In some embodiments, dispersion bumps 362 extend in rings around opening 360. In some embodiments, the dispersion bumps are circular. In some embodiments, multiple rings of dispersion bumps extend around opening 360. In some embodiments, dispersion bumps are arranged in rows or lines extending radially from the edge of opening 360.

FIG. 4A is a view of a segment of an embodiment of a de-bubbling slide 400. De-bubbling slide 400 has a median line 402 extending along the length of the de-bubbling slide, which separates upper surface 404 from lower surface 406. An opening 408 in upper surface 404 provides a path for gas, formerly trapped in a fluid such as photoresist, to escape from the de-bubbling slide during travel of the fluid from the upper end to the lower end of the de-bubbling slide. Cross-sectional line C-C' in FIG. 2A and cross-sectional line C-C' in FIG. 4A are the same cross-sectional line. In some embodiments, the openings in the upper surface 404 range from 10% to 90% of the total area of the upper surface 404. Openings are present in the upper surface 404 of the de-bubbling slide in order to allow dissolved gases and bubbles of gas in the flow of fluid to disperse after exiting the fluid. The total area of the openings in the upper surface is related to the ability to clean and decontaminate the de-bubbling slide. De-bubbling slides with upper areas having less than 10% of the upper area dedicated to gas dispersal openings for are more difficult and/or slower to clean and flush than when the upper area is more open. De-bubbling slides with upper surfaces that have more than 90% of the upper surface area as gas dispersal openings are more difficult to manufacture and/or install in the reservoir without damage.

A size of the opening differs according to some embodiments. FIG. 4B is a cross-sectional view of a segment 410 of a de-bubbling slide along cross-sectional line C-C', in accordance with some embodiments. In FIG. 4B, a segment 410 of a de-bubbling slide has an opening 414 which is entirely above median line 416 of the de-bubbling slide. The lower surface 412, or slide surface, of the de-bubbling slide below the median line 416 is uninterrupted. From a center of the segment 410, and angle 418 which describes the position the edge of the opening 414 ranges from 0° to about 25°.

FIG. 4C is a view of a segment 420 of a de-bubbling slide along cross-sectional line C-C', in accordance with some embodiments. In FIG. 4C, opening 424 extends a below median line 426 of the segment 420. Thus, some of lower surface 422 of the segment 420 is cutaway. An angle 428 describes the position of the edge of the opening 424 on lower surface 422, and ranges from about 0° to not more than 22°. For examples of de-bubbling slide segments having openings therein, resembling either and 410 in FIG. 4B, or resembling segment 420 in FIG. 4C, the size of the opening (see opening 414 or opening 424) is a function of the amount of gas being removed from the fluid during the de-bubbling process. If bubbles of pressurization gas in the fluid pop upon reaching an upper surface of the fluid within a segment of the de-bubbling slide, the partial pressure of gas above the fluid reduces the removal rate of the dissolved gases in the fluid.

Figure 4D:
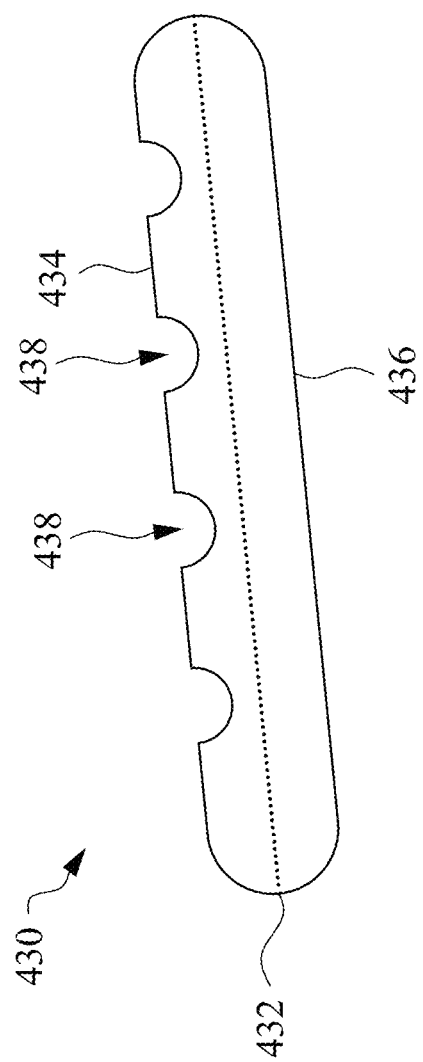

FIG. 4D is a view of segment 430 of a de-bubbling slide, in accordance with some embodiments. Dash line 432 has separating an upper surface 434 from a lower surface 436 of the de-bubbling slide. Segment 430 has holes 438 in upper surface 434. In some embodiments, less-viscous fluids lose bubbles of pressurization gas or experienced degassing of dissolved pressurization gas from the fluid at high rates than more-viscous fluids, and holes in an upper surface of the de-bubbling slide suffice to allow removed pressurization gas to escape from the de-bubbling slide.

In some embodiments, the de-bubbling slide is a channel formed by a coiled tube with cutaways or holes in an upper surface of the tube wall. In some embodiments, the slide is made of a metal alloy or a polymer material. In some embodiments, a slide surface of the channel is covered with a material to increase the contact angle of the edge of the flow against the slide surface of the channel. In some embodiments, the entire de-bubbling slide is made from a fluorocarbon material, including, but not limited to polytetrafluoroethylene (PTFE). In some embodiments, the slide surface is coated with a fluorocarbon material and the de-bubbling slide is made from a metal or a non-fluorocarbon polymer.

In a non-limiting embodiment, the de-bubbling slide includes a channel formed in a solid insert placed in the dispensing vessel. In some embodiments, the channel formed in a solid insert is a groove that spirals down an interior surface of a cylindrical solid insert configured to fit into a dispensing vessel.

Figure 5:
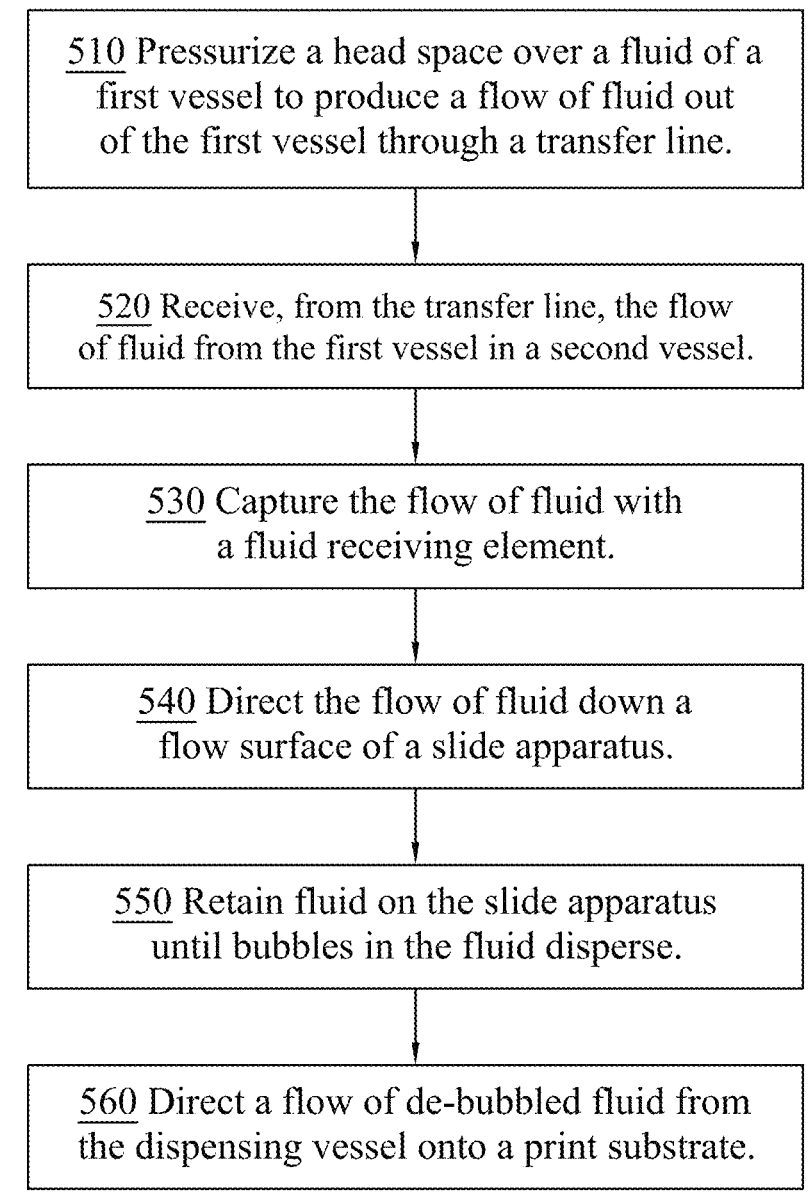
FIG. 5 is a flow diagram of a method for applying a fluid, in accordance with some embodiments.

FIG. 5 is a flow diagram of a method 500 of dispensing a fluid that has been de-bubbled, in accordance with some embodiments. In an operation 510, a pressurization gas is added to a headspace of a storage vessel containing a fluid, such as photoresist or another liquid patterning material. The pressurization gas added to the headspace increases the volume of the headspace and drives the fluid in a lower portion of the storage vessel out of the storage vessel through a transfer line. Pressurization gas added to the headspace dissolves in the fluid and sometimes forms bubbles in the fluid in the storage vessel and in the transfer line.

In an operation 520, the transferred fluid enters a dispensing vessel through the transfer line and the dispensing vessel receives the flow of fluid. Referring to FIG. 1, a transfer line, such as transfer line 106, conducts the pressurized fluid along a flow direction toward dispensing vessel 118. Fluid exiting the transfer line 106 enters the dispensing vessel in an upper region of the dispensing vessel. In some embodiments, the fluid enters at the top end of the dispensing vessel. In some instances, a distal end of the transfer line extends through the top or an upper sidewall of the dispensing vessel, releasing the fluid over a central volume of the dispensing vessel.

In an operation 530, the released fluid is captured within the dispensing vessel by a fluid receiving element at an upper end of a de-bubbling slide apparatus. In some embodiments, the fluid exiting the transfer line enters the fluid receiving element, lands on a landing surface of the fluid receiving element, and runs along an inner surface of the fluid receiving element in order to promote thinning of the fluid layer on the inner surface of the fluid receiving element, bringing any bubbles in the fluid closer to the top surface of the fluid.

In an operation 540, the fluid receiving element directs the flow of fluid from the transfer line to the length of the de-bubbling slide apparatus (the slide apparatus) through one or more openings in the fluid receiving element.

In an operation 550, the fluid flowing down the de-bubbling slide apparatus slides down the flow surface of the de-bubbling slide apparatus until some or all of the bubbles or dissolved gases in the fluid disperse. The speed of the fluid sliding or flowing down the flow surface of the de-bubbling slide is adjusted by adjusting the angle of the de-bubbling slide, as described herein. Bubbles in the fluid on the de-bubbling slide apparatus flow surface disperse by floating to a top surface of the flowing fluid and popping or bursting, releasing the bubble gas to an upper volume of the de-bubbling slide apparatus above the flow of fluid on the flow surface. Gas released from burst bubbles, or from outgassing of the fluid, exits the slide apparatus through openings in an upper surface of the de-bubbling slide apparatus. Fluid completes a slide down the de-bubbling slide apparatus to enter a lower region of the dispensing vessel. In some embodiments, the de-bubbling slide apparatus is configured to extend to a bottom of the dispensing vessel, to enable mixing of the fluid from the de-bubbling slide apparatus with fluid in the lower volume of the dispensing vessel, no matter the fluid level in the lower volume of the dispensing vessel. As the dispensing vessel fills, a lower length of the de-bubbling slide apparatus remain covered with the fluid, while an upper length of the de-bubbling slide apparatus performs the de-bubbling function.

In an operation 560, de-bubbled fluid from the dispensing vessel is directed onto a top surface of a print substrate, such as a semiconductor wafer, in order to perform a manufacturing process.

A fluid dispensing system performs a de-bubbling function of a fluid by directing a flow of fluid from a gas-pressurized supply vessel onto a de-bubbling slide located in a dispensing vessel in order to prolong a time between the fluid entering the dispensing vessel and mixing with any fluid in a lower volume of the dispensing vessel. The time is prolonged by directing the flow of fluid onto a slide that spreads the fluid on a flow surface thereof, giving bubbles and dissolved gas in the flow of fluid time to exit the fluid before the fluid collects in a lower volume of the dispensing vessel in which the de-bubbling slide is situated.

Aspects of the present disclosure relate to a device comprising a dispensing vessel having a fluid inlet in an upper portion thereof; and a de-bubbling slide configured to fit in the dispensing vessel, wherein a receiving element at an upper end of the de-bubbling slide is configured to receive a flow of fluid entering the dispensing vessel from the fluid inlet, and to direct the flow of fluid to a flow surface of the de-bubbling slide, and wherein an upper surface of the de-bubbling slide has at least one opening therein configured to allow gas dissolved in the flow of fluid, or bubbles in the flow of fluid, to escape the de-bubbling slide. In some embodiments, the receiving element has an opening therein configured to allow passage of the fluid form the receiving element to the flow surface of the de-bubbling slide. In some embodiments, the device further comprises at least one dispersing element on a landing surface of the receiving element, wherein the dispersing element is configured to spread the flow of fluid across the landing surface of the receiving element without forming bubbles in the fluid. In some embodiments, the flow surface of the de-bubbling is an interior surface of a tube, and wherein the upper surface of the de-bubbling slide is an upper portion of the tube wall. In some embodiments, the at least one opening further comprises slots across the upper surface of the de-bubbling slide. In some embodiments, the at least one opening comprises greater than 10% of the total area of the upper surface. In some embodiments, the de-bubbling slide is a circular coil in the reservoir. In some embodiments, the device further comprises a flow-modifying coating on the flow surface of the de-bubbling slide. In some embodiments, the flow-modifying coating is a hydrophobic coating. In some embodiments, the flow-modifying coating, or a de-bubbling slide material, is a fluorocarbon material. In some embodiments, the fluorocarbon material is polytetrafluoroethene (PTFE).

Aspects of the present disclosure relate to a method, which includes receiving, in a first vessel, a flow of fluid from a second vessel, wherein the flow of fluid is generated by pressurizing a head space over the fluid in the second vessel; capturing the flow of fluid from the second vessel at an upper end of a de-bubbling slide in the first vessel; and directing the flow of fluid along a flow surface of de-bubbling slide to a lower portion of the first vessel, such that bubbles and dissolved gases in the fluid exit the fluid on the flow surface of the de-bubbling slide. In some embodiments, the method further comprises adjusting a flow rate of the fluid into the first vessel to regulate the flow rate of fluid on the de-bubbling slide. In some embodiments, the method further comprises adjusting an angle of the flow surface of the de-bubbling slide within the first vessel to regulate the flow velocity of the fluid on the de-bubbling slide. In some embodiments, adjusting the rate of de bubbling of the flow of fluid further comprises reducing the flow surface angle to increase a residence time of the flow of fluid on the flow surface. In some embodiments, the method further comprises dispensing a volume of the fluid from the lower portion of the first vessel onto a surface of a semiconductor wafer.

Aspects of the present disclosure relate to a system for dispensing a fluid, comprising: a gas source for supplying pressurization gas to a head space of a first vessel containing the fluid and generating a flow of fluid to a second vessel; a transfer line configured to direct the flow of fluid into the second vessel; and a de-bubbling slide in the second vessel configured to receive the flow of fluid at a fluid receiving element at an upper end of the de-bubbling slide, and to delay the movement of the flow of fluid to a lower volume of the second vessel, wherein bubbles and dissolved gases in the flow of fluid exit the fluid while moving along the de-bubbling slide to the lower volume of the second vessel. In some embodiments, the de-bubbling slide further comprises dispersing bumps on an upper surface of the fluid receiving element to promote spreading of the fluid across the upper surface of the fluid receiving element before directing the flow of fluid into the de-bubbling slide. In some embodiments, the de-bubbling slide further comprises a coiled tube with openings in an upper surface of the coiled tube. In some embodiments, the de-bubbling slide further comprises a fluorocarbon material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a dispensing vessel having a fluid inlet in an upper portion thereof; and
   a de-bubbling slide configured to fit in the dispensing vessel, wherein the de-bubbling slide has a helical tube shape, a receiving element at an upper end of the de-bubbling slide is configured to receive a flow of fluid entering the dispensing vessel from the fluid inlet, and to direct the flow of fluid to a flow surface of the de-bubbling slide, an upper surface of the de-bubbling slide has a plurality of openings therein configured to allow gas dissolved in the flow of fluid, or bubbles in the flow of fluid, to escape the de-bubbling slide, and an uppermost surface of a first opening of the plurality of openings is vertically displaced from an uppermost surface of a second opening of the plurality of openings.

2. The device of claim 1, wherein the receiving element has an opening therein configured to allow passage of the flow of fluid from the receiving element to the flow surface of the de-bubbling slide.

3. The device of claim 1, further comprising at least one dispersing element on a landing surface of the receiving element, wherein a dispersing element is configured to spread the flow of fluid across the landing surface of the receiving element without forming bubbles in the fluid.

4. The device of claim 1, wherein the flow surface of the de-bubbling slide is an interior surface of a tube, and wherein the upper surface of the de-bubbling slide is an upper portion of a tube wall.

5. The device of claim 4, wherein the at least one opening further comprises slots across the upper surface of the de-bubbling slide.

6. The device of claim 4, wherein the at least one opening comprises greater than 10% of a total area of the upper surface.

7. The device of claim 1, wherein the de-bubbling slide is a circular coil in the dispensing vessel.

8. The device of claim 1, further comprising a flow-modifying coating on the flow surface of the de-bubbling slide.

9. The device of claim 8, wherein the flow-modifying coating is a hydrophobic coating.

10. The device of claim 9, wherein the flow-modifying coating, or a de-bubbling slide material, is a fluorocarbon material.

11. The device of claim 10, wherein the fluorocarbon material is polytetrafluoroethene (PTFE).

12. A system for dispensing a fluid, comprising:
a gas source for supplying pressurization gas to a head space of a first vessel containing the fluid and generating a flow of fluid to a dispensing vessel having a fluid inlet in an upper portion thereof;
a transfer line configured to direct the flow of fluid into the dispensing vessel; and
a de-bubbling slide in the dispensing vessel configured to receive the flow of fluid at a fluid receiving element at an upper end of the de-bubbling slide, the receiving element having a bowl shape, the de-bubbling slide is configured to direct the flow of the fluid to a flow surface, and to delay collection of the flow of fluid in a lower volume of the dispensing vessel, wherein the de-bubbling slide has at least one opening therein configured to allow gas dissolved in the flow of fluid, or bubbles in the flow of fluid to escape the de-bubbling slide, and bubbles and dissolved gases in the flow of fluid exit the fluid while moving along the de-bubbling slide to the lower volume of the dispensing vessel, wherein
the de-bubbling slide further comprises dispersing bump protrusions on an upper surface of the fluid receiving element to promote spreading of the fluid across the upper surface of the fluid receiving element before directing the flow of fluid into the de-bubbling slide, and the dispersing bump protrusions surround an output of the fluid receiving element.

13. The system of claim 12, wherein each of the dispersing bump protrusions is vertically above the at least one opening.

14. The system of claim 13, wherein the de-bubbling slide further comprises a helical tube with openings in an upper surface thereof.

15. A device, comprising:
a dispensing vessel having a fluid inlet in an upper portion thereof; and
a de-bubbling slide in the dispensing vessel, wherein the de-bubbling slide has a helical tube shape, and the de-bubbling slide comprises:
a receiving element at an upper end of the de-bubbling slide is configured to receive a flow of a fluid from the fluid inlet, wherein the receiving element comprises a plurality of bumps thereon;
the de-bubbling slide is connected to the receiving element, wherein the de-bubbling slide is configured to receive the flow of the fluid from the receiving element; and
a plurality of openings in a top surface of the de-bubbling slide, wherein each of the plurality of openings is configured to allow gas to escape the de-bubbling slide, and each of the plurality of openings is displaced in a vertical direction and in a direction along the de-bubbling slide from an adjacent opening of the plurality of openings.

16. The device of claim 15, further comprising bump protrusions on an upper surface of the receiving element, the receiving element has a bowl shape, and the dispersing bump protrusions surround an output of the receiving element.

17. The device of claim 15, wherein the de-bubbling slide comprises a metal or a polymer.

18. The device of claim 15, wherein the dispensing vessel further comprises an evacuation line to permit the gas to escape the dispensing vessel.

19. The device of claim 18, further comprising a pump connected to the evacuation line.

20. The device of claim 19, wherein the pump is configured to generate a negative pressure in the evacuation line.

* * * * *